(12) United States Patent
Carey et al.

(10) Patent No.: US 7,679,866 B2
(45) Date of Patent: Mar. 16, 2010

(54) CPP SPIN VALVE WITH LONG SPIN DIFFUSION LENGTH AP1 LAYERS

(75) Inventors: Matthew Joseph Carey, San Jose, CA (US); Shekar Chandrashekariaih, San Jose, CA (US); Stefan Maat, San Jose, CA (US); Jeffrey Robinson Childress, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 111 days.

(21) Appl. No.: 11/944,082

(22) Filed: Nov. 21, 2007

(65) Prior Publication Data

US 2008/0074807 A1    Mar. 27, 2008

Related U.S. Application Data

(63) Continuation-in-part of application No. 11/525,790, filed on Sep. 21, 2006.

(51) Int. Cl.
*G11B 5/39* (2006.01)

(52) U.S. Cl. .................................. 360/324.11

(58) Field of Classification Search ........ 360/324–324.2
See application file for complete search history.

(56) References Cited

U.S. PATENT DOCUMENTS

| | | | | |
|---|---|---|---|---|
| 6,356,419 B1 | 3/2002 | Gill | | 360/324.11 |
| 6,549,383 B1 | 4/2003 | Gill | | 360/324.11 |
| 6,583,969 B1 | 6/2003 | Pinarbasi | | 360/324.11 |
| 6,751,072 B2 | 6/2004 | Freitag et al. | | 360/324.11 |
| 6,903,904 B2 | 6/2005 | Li et al. | | 360/324.11 |
| 2001/0030842 A1* | 10/2001 | Pinarbasi | | 360/324.11 |
| 2004/0165321 A1 | 8/2004 | Hasegawa et al. | | 360/324.11 |
| 2005/0186452 A1 | 8/2005 | Zhang et al. | | 428/828 |
| 2005/0201022 A1 | 9/2005 | Horng et al. | | 360/324.11 |
| 2005/0219773 A1 | 10/2005 | Li et al. | | 360/324.12 |
| 2005/0264952 A1 | 12/2005 | Oshima | | 360/324.11 |
| 2006/0044704 A1 | 3/2006 | Li et al. | | 360/324.11 |
| 2006/0061915 A1 | 3/2006 | Zhang et al. | | 360/324.11 |
| 2006/0087771 A1 | 4/2006 | Gill | | 360/324.11 |
| 2006/0092580 A1 | 5/2006 | Carey et al. | | 360/324.11 |
| 2006/0098355 A1 | 5/2006 | Ikarashi et al. | | 360/324.11 |
| 2006/0168797 A1* | 8/2006 | Li et al. | | 29/603.07 |
| 2006/0193089 A1 | 8/2006 | Li et al. | | 360/324.11 |
| 2006/0198062 A1 | 9/2006 | Ide et al. | | 360/324.12 |

OTHER PUBLICATIONS

Nagasaka et al. "CPP-GMR Technology for Future High-Density Magnetic Recording" Fujitsu Sci. Tech J. 42,1, p. 149-157 Jan. 2006.

(Continued)

*Primary Examiner*—William J Klimowicz
(74) *Attorney, Agent, or Firm*—Zilka-Kotab, PC

(57) ABSTRACT

A magnetoresistive sensor having a pinned layer that includes a first magnetic layer (AP1) a second magnetic layer (AP2) and an antiparallel coupling layer sandwiched between the AP1 and AP2 layers. The AP1 layer is adjacent to a layer of antiferromagnetic material (AFM layer) and is constructed so as to have a long spin diffusion length. The long spin diffusion length of the AP1 layer minimizes the negative GMR contribution of the AP1 layer, thereby increasing the overall GMR effect of the sensor.

9 Claims, 9 Drawing Sheets

OTHER PUBLICATIONS

Oshima et al. "Novel Synthetic Ferrimagnet Pinned Layers for Metallic CPP Spin Valves Requiring High Pinning-Field and Output" IEEE Transactions on Magnetics, vol. 41, No. 10, Oct. 2005.

"Double Magnetic Tunnel Junction with Large Spin Diffusion Length Free Layer" ip.com Prior Art Database Sep. 22, 2003.

Strelkov et al. "Extension of the semiclassical theory of current-perpendicular-to-plane giant magnetoresistance including spin flip to any multilayed magnetic structures" Journal of Applied Physics vol. 94, No. 5 Sep. 1, 2003.

* cited by examiner

CPP SPIN VALVE WITH LONG SPIN DIFFUSION LENGTH AP1 LAYERS

RELATED APPLICATIONS

This application is a Continuation in Part application of commonly assigned U.S. patent application Ser. No. 11/525,790 entitled CURRENT PERPENDICULAR TO PLANE (CPP) MAGNETORESISTIVE SENSOR WITH IMPROVED PINNED LAYER, filed Sep. 21, 2006.

FIELD OF THE INVENTION

The present invention relates to magnetoresistive sensors and more particularly to a current perpendicular to plane (CPP) magnetoresistive sensor that avoids spin torque noise and has a small gap.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between a magnetic pinned layer structure and a free layer. First and second leads are connected to the spin valve sensor for conducting a sense current therethrough. The magnetization of the pinned layer is oriented generally perpendicular to the air bearing surface (ABS) and the magnetic moment of the free layer is oriented generally parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. The ferromagnetic layer next to the spacer layer is typically referred to as the reference layer. A spin valve is also known as a top or bottom spin valve depending upon whether the pinning layer is at the top (formed after the free layer) or at the bottom (before the free layer).

The CIP spin valve sensor is located between first and second nonmagnetic electrically insulating read gap layers and the first and second read gap layers are located between ferromagnetic first and second shield layers. In a CPP spin valve, the sensor is sandwiched between first and second leads which can also function as the shields. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn, IrMn, NiMn, or IrMnX (X=Cr). While an antiferromagnetic (AFM) material does not in and of itself have a magnetization, when exchange coupled with a magnetic material, it can strongly pin the magnetization of the ferromagnetic layer.

The ever increasing demand for increased data rate and data capacity has lead a relentless push to develop magnetoresistive sensors having improved signal amplitude and reduced track width. Sensors that show promise in achieving higher signal amplitude at high recording densities are current perpendicular to plane (CPP) sensors. Such sensors conduct sense current from top to bottom, perpendicular to the planes of the sensor layers. Examples of CPP sensors include CPP GMR sensors. A CPP GMR sensor operates based on the spin dependent scattering of electrons through the sensor, similar to a more traditional current in plane (CIP) GMR sensor except that, as mentioned above, the sense current flows perpendicular to the plane of the layers.

However, a problem experienced by CPP GMR sensors is that they suffer from spin torque noise. As those skilled in the art will appreciate, spin torque noise occurs when electrons pass from one magnetic layer to another magnetic layer through a spacer. The polarization of the electrons and the magnetization of the free layer affect one another. For example, the torque from polarized electrons originating from the reference layer can destabilize the magnetization of the free layer, causing spin torque noise, and vice versa. This will adversely affect the signal to noise ratio of a sensor, making the CPP GMR impractical.

One way to avoid spin torque noise is to construct a CPP GMR sensor as a dual sensor having a free layer disposed between two pinned layer structures. Several factors have, however, made such dual spin CPP GMR sensors impractical. For example, in order to provide sufficient pinned layer stability it has been necessary to construct the pinned layers as antiparallel coupled AP pinned layers as described above. This design concept minimizes magneto-static coupling between the pinned layer structures and the free layer. Unfortunately, a CPP GMR suffers a reduction in GMR performance (dR/R) when an AP coupled pinned layer is used. This is because, the magnetic pinned layer furthest from the spacer layer (AP1) has a negative contribution to the GMR effect. As those skilled in the art will appreciate, this is due to the fact that this layer is pinned in a direction opposite to the magnetic pinned layer closest to the spacer layer (AP2). Since a dual CPP sensor has two such AP coupled pinned layers, this problem is even worse in a dual CPP GMR sensor.

Therefore, there is a need for a CPP GMR design that can mitigate the effects of spin torque noise while also maximizing the GMR effect or performance of such a sensor. Such a design would preferably also minimize the negative contribution to GMR that would be provided by an AP coupled pinned layer.

SUMMARY OF THE INVENTION

The present invention provides a magnetoresistive sensor having a pinned layer that includes a first magnetic layer (AP1) a second magnetic layer (AP2) and an antiparallel coupling layer sandwiched between the AP1 and AP2 layers. The AP1 layer is adjacent to a layer of antiferromagnetic material (AFM layer) and is constructed so as to have a long spin diffusion length. The long spin diffusion length of the AP1 layer minimizes the negative GMR contribution of the AP1 layer, thereby increasing the overall GMR effect of the sensor.

The AP1 layer can include one or more layers of long diffusion length material such as Co, or Ni. The AP1 layer an also include a spin mixer layer such as Ta within its structure, or a spin scattering layer such as Ru within its structure, in order to scatter electrons in a non-GMR-contributing manner.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
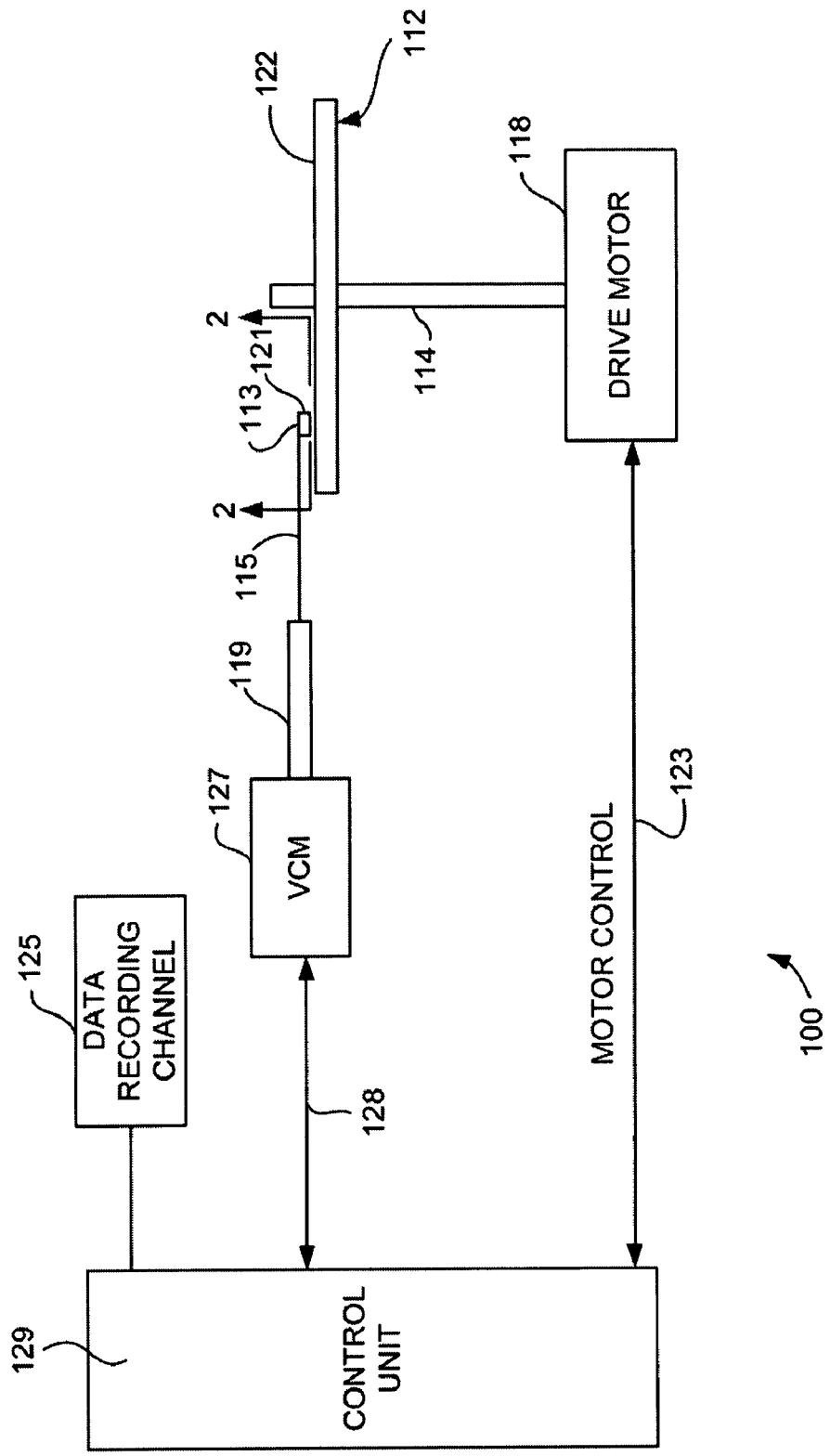
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
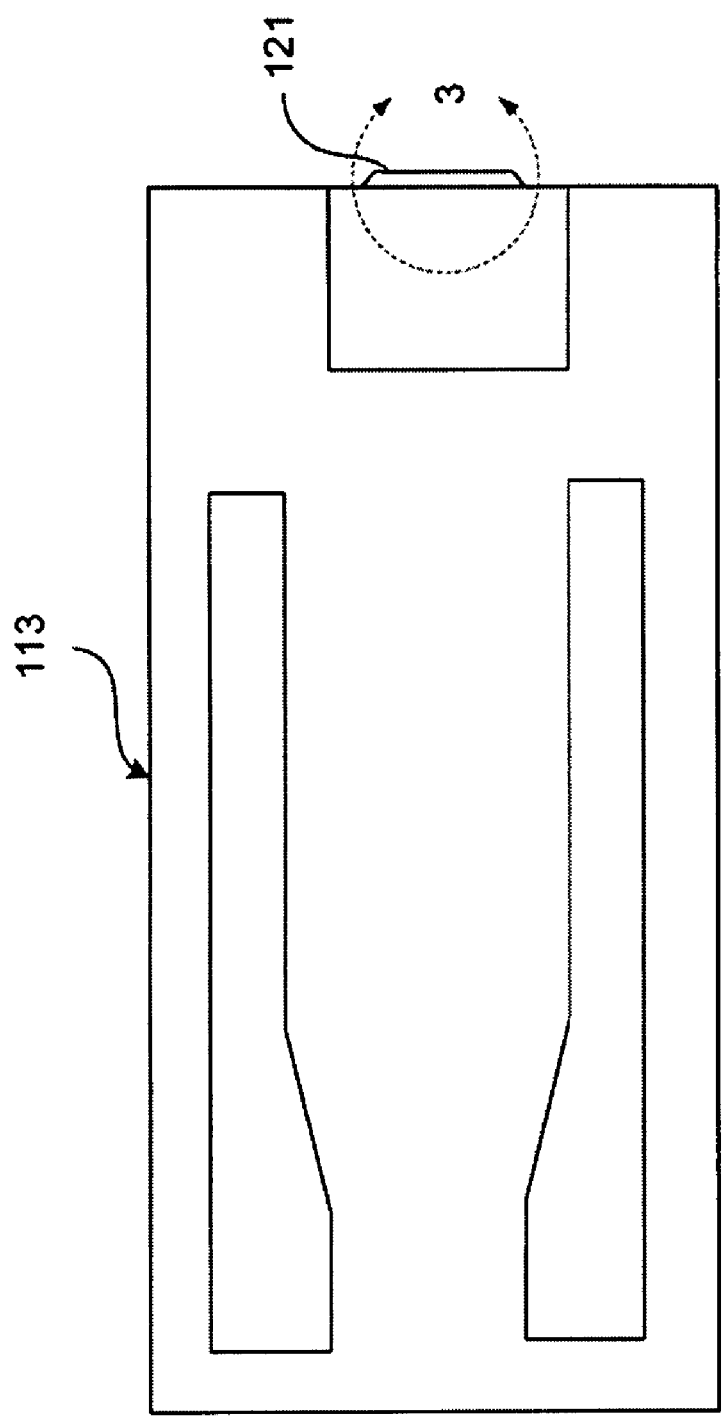
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
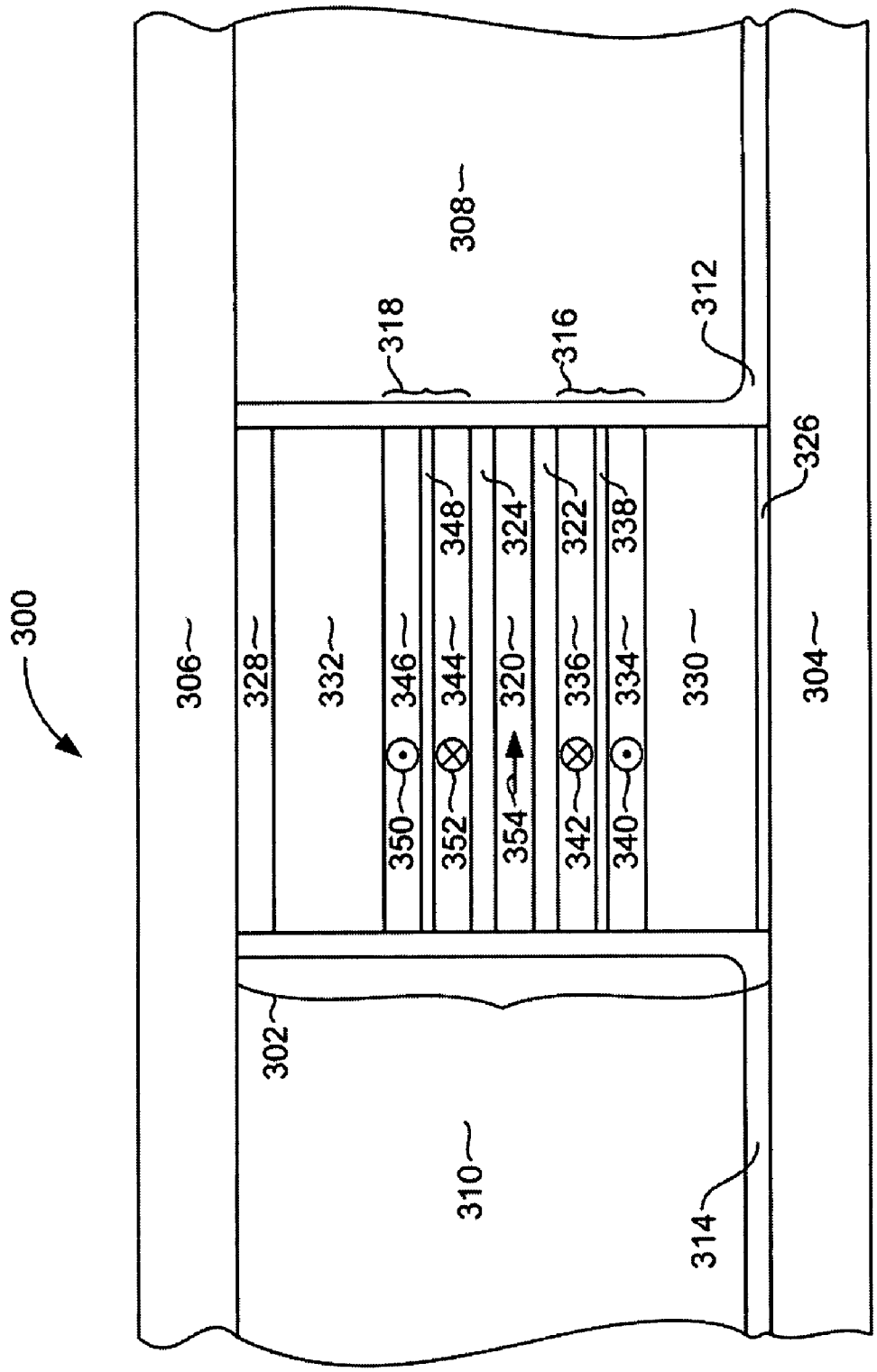
FIG. 3 is an enlarged ABS view taken from circle 3 of FIG. 2 rotated 90 degrees counterclockwise, showing a dual CPP GMR sensor according to an embodiment of the invention.

With reference now to FIG. 3, a current perpendicular to plane giant magnetoresistive (CPP GMR) sensor 300 according to an embodiment of the invention includes a sensor stack 302 that is sandwiched between first and second electrically conductive leads 304, 306, which supply a sense current to the sensor during operation. The leads 304, 306 can be constructed of a magnetic material such as NiFe so that they can function as magnetic shield layers as well as electrical leads. First and second hard bias layers 308, 310 extend laterally from the sides of the sensor stack 302. The hard bias layers 308, 310 are constructed of a hard magnetic material such as CoPtCr, etc. and provide a bias field for biasing the magnetization of the free layer, as will be described in greater detail below. First and second side insulation layers 312, 314 are formed at either lateral side of the sensor stack and across the surface of the first lead 304 to prevent sense current from being shunted through the hard bias layers 308, 310.

With continued reference to FIG. 3, the sensor stack 302 includes first and second pinned layer structures 316, 318. A magnetic free layer 320 is disposed between the first and second pinned layer structures 316, 318. A first non-magnetic, electrically conductive spacer layer 322 is sandwiched between the first pinned layer structure 316 and the free layer 320, and a second non-magnetic, electrically conductive spacer layer 324 is sandwiched between the free layer 320 and the second pinned layer structure 318. The spacer layers 322, 324 can be, for example Cu.

A seed layer 326 such as NiFeCr, Ru or Ta may be provided at the bottom of the sensor stack 302, and a capping layer 328 such as Ta or Ru may be provided at the top of the sensor stack 302 to protect the sensor layers during manufacture. A first layer of antiferromagnetic material (first AFM 330) is provided near the bottom of the sensor stack 302 and is exchange coupled with the first pinned layer structure 316. Similarly, a second layer of antiferromagnetic material (second AFM 332) is provided near the top of the sensor stack 302 and is exchange coupled with the second pinned layer structure 318.

One or both (preferably both) of the pinned layer structures 316, 318 are antiparallel coupled (AP pinned) structures. Therefore, the first pinned layer structure 316 includes a first magnetic layer (AP1) 334, a second magnetic layer (AP2) 336 and a non-magnetic antiparallel coupling layer 338 sandwiched between the AP1 and AP2 layers 334, 336. The AP coupling layer 338 can be constructed of, for example, Ru and can have a thickness of, for example, 4-10 Angstroms. The composition of the AP1 and AP2 layers 334, 336 will be discussed in greater detail below with reference to FIG. 4. The AP1 layer 334 is exchange coupled with the first AFM layer 330 which strongly pins the magnetization 340 of the AP1 layer in a direction generally perpendicular to the plane of the air bearing surface (ABS). Strong antiparallel coupling between the AP1 and AP2 layers 334, 336 pins the magnetization 342 of the AP2 layer 336 in a direction generally perpendicular to the ABS and antiparallel to the magnetization 340 of the AP1 layer 334.

Similar to the first pinned layer structure 316, the second pinned layer structure 318 is preferably an AP coupled structure that includes a first magnetic layer AP2B 344, a second magnetic layer AP1B 346 and a non-magnetic antiparallel coupling layer 348 sandwiched between the AP2B and AP1B layers 344, 346. The coupling layer 348 can be constructed of Ru and can have a thickness of 4 to 10 Angstroms. The structure of the AP2B and AP1B layers 344, 346 will be discussed further below with reference to FIG. 5.

The AP1B layer 346 is exchange coupled with the second AFM layer 332, which strongly pins the magnetization 350 of the AP1B layer in a direction generally perpendicular to the ABS. Antiparallel coupling between the AP2B and AP1B layers 344, 346 strongly pins the magnetization 352 of the AP2B layer 344 in a direction generally antiparallel with the magnetization 350 of the AP1B layer 346. The magnetizations 340, 342, 350, 352 should be oriented in such a manner that the magnetizations 342, 352 of the innermost magnetic layers 336, 344 (those closest to the spacers 322, 324) are oriented in the same direction (i.e. parallel with one another) so that their GMR contributions are additive and do not cancel one another out.

With continued reference to FIG. 3, the free layer 320 can be constructed of a low coercivity magnetic material such as one or more layers of Co, CoFe or NiFe. The free layer 320 has a magnetization 354 that is biased in a direction generally parallel with the ABS as shown, but which is able to move in response to a magnetic field. The magnetization 354 of the free layer 320 is biased by a magnetic bias field from the hard bias layers 308, 310.

Figure 4:
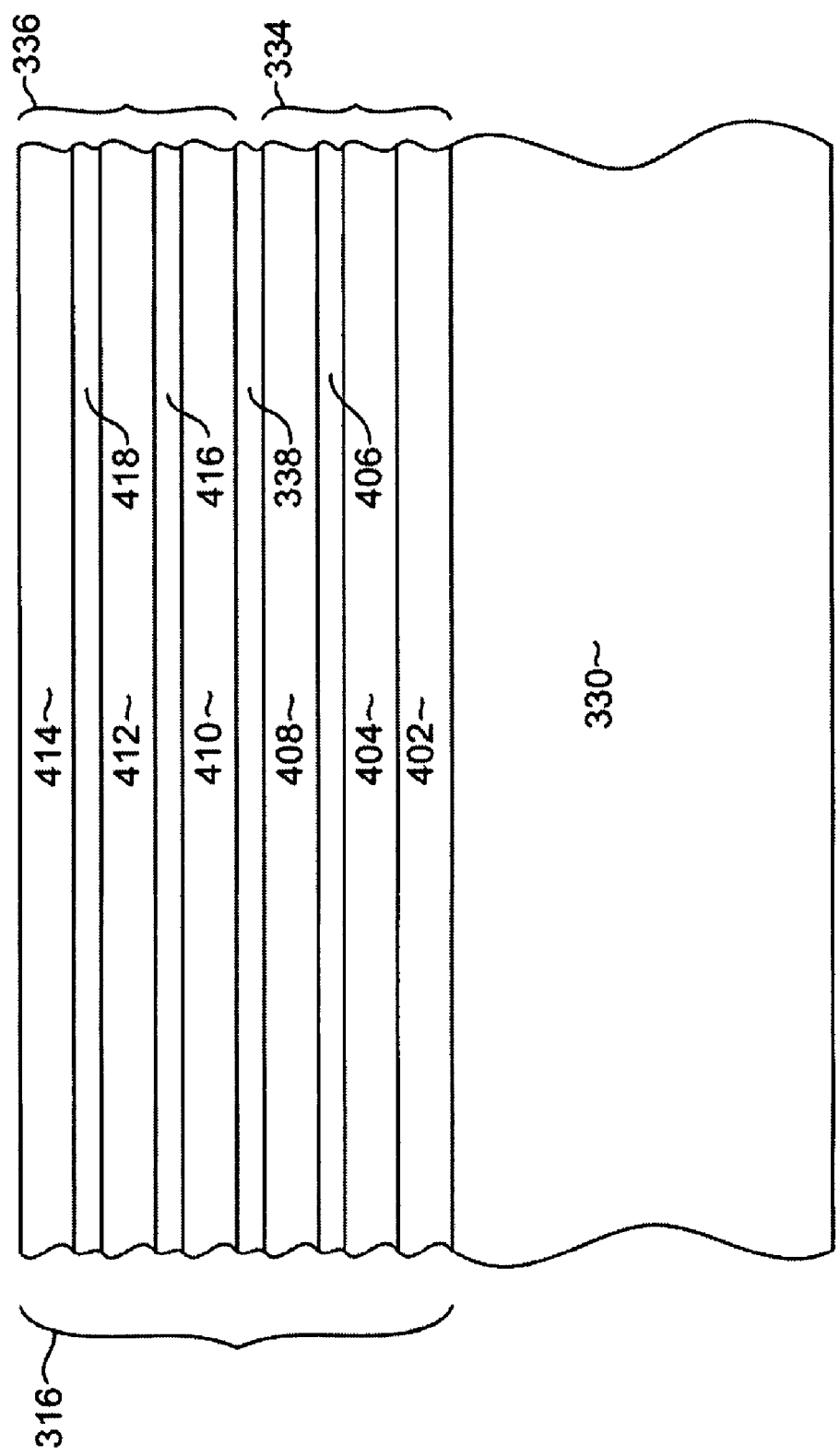
FIG. 4 is an enlarged, detailed view of a first pinned layer structure according to an embodiment of the invention.

With reference now to FIG. 4, the composition of the first pinned layer structure 316 can be seen in greater detail. As discussed above, the pinned layer 316 includes a first magnetic structure (AP1) 334 and a second magnetic structure (AP2) 336 with a non-magnetic antiparallel coupling layer (AP coupling layer 338 sandwiched between the AP1 and AP2 layers 334, 336. As mentioned above, the AP2 layer 336 has a positive contribution to the overall GMR of the sensor, while the AP1 layer 334 has a negative or subtractive contribution to the overall GMR of the sensor. Therefore, it is desirable to maximize the GMR contribution of the AP2 layer 336, while minimizing the GMR contribution of the AP1 layer 334. This must be accomplished while also ensuring that the AP1 and AP2 layers have substantially equal magnetic moments, maintaining strong exchange coupling with the AFM layer 330, and also maintaining strong antiparallel coupling between the AP1 and AP2 layers, all of these being necessary to ensure strong pinning of the pinned layer structure 316. A pinned layer structure according to an embodiment of the invention, and as described below, addresses these challenges.

The AP1 layer 334 is constructed upon the first AFM layer 330. The AFM layer is preferably constructed of IrMn or IrMnCr and preferably has a thickness of 40-90 Angstroms or about 70 Angstroms. An IrMn or IrMnCr AFM layer in this thickness range provides sufficient exchange pinning to fix the magnetization of the pinned layer while having the smallest possible contribution to gap thickness.

The AP1 layer 334 includes a CoFe layer 402 deposited on top of the AFM layer 330. CoFe provides excellent exchange pinning with the IrMn or IrMnCr AFM layer, and the best exchange pinning is achieved when the Fe content of the CoFe layer 402 is around 20 to 60 atomic percent or about 40 atomic percent. Therefore, the CoFe layer 402 preferably has an Fe content of 20 to 60 atomic percent or about 40 atomic percent. The CoFe layer 402 may also have a thickness of 8-20 Angstroms or about 10 Angstroms. This thickness range allows the CoFe layer 402 to be as thin as possible while still providing good exchange coupling with the IrMn or IrMnCr AFM layer 330.

A first Co layer 404 is formed on top of the CoFe layer 402. The first Co layer 404 can have a thickness of 5-15 Angstroms or about 10 Angstroms, although other thicknesses are, of course, possible as well. The thickness of the Co layer 404 is preferably, however, chosen to balance the magnetic moments of the AP1 and AP2 layers 334, 346. A thin spin blocking layer 406 is formed on top of the first Co layer 404. A second layer of Co 408 is formed over the spin blocking layer 406 so that the spin blocking layer 406 is sandwiched between the first and second Co layers 404, 408. As mentioned above, the AP1 layer 334 has a subtractive GMR effect. That is to say that the AP1 layer 334 reduces the GMR performance of the sensor 300 because of its magnetic orientation being opposite to that of the AP2 layer 336. The AP1 layer 334 is, however, necessary to provide sufficient pinning strength. The spin blocking layer 406 reduces the negative GMR effect of the AP1 layer 334. Several materials can be used to form the spin blocking layer 406, such as Ta, PtMn, Pt, etc. The blocking layer 406 is preferably constructed of Ta, because Ta has a very short spin diffusion length, allowing the spin blocking layer 406 to be thinner than would be possible with other materials having larger spin diffusion lengths. Because spin blocking materials are non-magnetic materials it is important to keep the spin blocking layer sufficiently thin that the Co layers 404, 408 do not magnetically decouple. Since the spin diffusion length of Ta is very small, a Ta spin blocking layer 406 can be constructed to have a thickness of 1-7 Angstroms or about 4 Angstroms. The spin blocking layer 406 scatters electrons in a non-GMR contributing manner, i.e. depolarizes the electron spin current thereby reducing the negative (or subtractive GMR) contribution of the AP1 layer 334. The two Co layers 404, 408 could be considered to be a single Co layer with a very thin spin blocking layer interspersed therein.

In order to minimize the negative GMR effect of the AP1 layer, it should be made either physically very thin or thin compared with the spin diffusion length of it's constituent materials. It would then be desirable to make the magnetic material of the AP1 layer include as much of a long spin diffusion length material, such as Co, as possible. The spin diffusion length of CoFe is about 100 Angstroms, whereas the spin diffusion length of Co is about 500 Angstroms. The spin diffusion length of a material can be defined as the mean-free path that describes the relaxation of electron spin accumulation in a material. In other words, a material with a shorter spin-diffusion length will cause an electron current to polarize (for a ferromagnetic material) or depolarize (for a non-ferromagnetic material) over a shorter distance. Whereas electron scattering in the spin blocking layer 406 does not contribute to the GMR (desirable in the AP1 structure), electron scattering in the magnetic layers 402, 404, 408 does contribute to GMR and does so in a negative or subtractive manner. Since it is desirable to minimize the negative GMR contribution of the AP1 layer while still providing a sufficient magnetic moment to strongly AP couple the pinned layer, it is desirable that the magnetic layers 402, 404, 408 of the AP1 layer have the highest possible spin diffusion length. However, the AP1 layer cannot be constructed entirely of Co, because Co does not provide good exchange coupling with IrMn or IrMnCr. It is therefore desirable to have a thin layer of CoFe at the surface of the IrMn or IrMnCr AFM layer 330, the thickness of the CoFe layer being just sufficient to ensure good exchange coupling with the AFM layer. As discussed above, this thickness of the CoFe layer 402 can be 8-20 Angstroms or about 10 Angstroms.

In addition, in order to maximize the non-GMR contributing spin diffusion properties of the spin diffusion layer 406, it is desirable to locate the spin diffusion layer 406 as close as possible to the AP coupling layer 338. However, if the spin diffusion layer 406 is too close to the AP coupling layer 338, the antiparallel coupling of the AP1 and AP2 layers 334, 336 suffers. Therefore, in order to maximize the spin blocking effect of the spin blocking layer 406, while also ensuring good AP coupling, the second Co layer 408 is preferably constructed with a thickness of 8-18 Angstroms or about 14 Angstroms.

As mentioned above, it is desirable to maximize the GMR contribution of the AP2 layer. With continued reference to FIG. 4, the AP2 layer 336 preferably includes layers of CoFe with very thin nano-layers (such as thin layers of Cu) interspersed therein. More specifically, and by way of example, the AP2 layer can include first, second and third CoFe layers 410, 412, 414, with very thin layers of Cu 416, 418 interspersed therein.

The composition of the CoFe layers 410, 412, 414 has a large effect on the dR/R of the sensor 300. The dR/R performance is maximized when the Fe content of the CoFe layers 410, 412, 414 of the AP2 layers is about 50 atomic percent Fe. The reason for this increase is in dR/R is an increased bulk scattering of electrons, bulk scattering being more important in a CPP sensor than in a CIP sensor. However, the CoFe layers 410, 412, 414 need not have exactly 50 atomic percent Fe, and could contain 25-75 atomic percent Fe. For ease of manufacture, the magnetic layers 410, 412, 414 could be constructed of the same material as the layer 402 of the AP1 layer (i.e. 40 percent Fe) so that the same target can be used to sputter deposit the layers 410, 412, 414 as was used to construct the earlier deposited layer 402.

In general, increasing the thickness of the AP2 layer will increase dR/R. This increase occurs up to about the spin diffusion length of the magnetic material in AP2 layer 336. However, this increase in dR/R must be balanced with the need to maintain strong pinning. The thickness of the magnetic layers 410, 412, 414 cannot be increased beyond the ability of the AFM exchange coupling and antiparallel coupling to maintain strong pinning. Therefore, the total combined thickness of the magnetic layers 410, 412, 414 is preferably about 20-50 Angstroms.

Adding the Cu nano-layer 416, 418 into the AP2 structure 336 increases dR/R by adding interfacial scattering sites. Just as with the Ta layer 406 in the AP1 layer 334, the Cu nano-layer cannot be too thick or the CoFe layers 410, 412, 414 will become magnetically decoupled. The Cu layers 416, 418, therefore, preferably have a thickness of up to about 7 Angstroms or a range of 1-7 Angstroms. Other materials may be used in the layers 416, 418 rather than Cu, such as, for example, Au or Ag. In addition, although the AP2 structure 336 is shown having three magnetic layers 410, 412, 414 and two Cu layers 416, 418, other numbers of magnetic layers and Cu nano-layers can be used. The best results have been found, however, with the use of three magnetic layers 410, 412, 414, and two nano-layers 416, 418. It also is not necessary that the magnetic layers 410, 412, 414 be of equal thicknesses.

As mentioned above, the thickness of the first Co layer 404 is preferably chosen to balance the magnetic moments of the AP1 and AP2 layers 334, 336. Once the total magnetic layer thickness of the layers 410, 412, 414 of the AP2 structure have been chosen, as well as the best thickness for the CoFe layer 402 and Co layer 408 of the AP1 layer 334, the thickness of the first Co layer 404 can be chosen so that the magnetic moments of the AP1 layer 334 and AP2 layer are as close to equal as possible so as to minimize the remnant magnetic moment of the pinned layer 316.

Although the first pinned layer structure 316 has been described in detail, it should be understood that the second pinned layer 318 can be constructed substantially as a mirror image of the first pinned layer 316, with the order of layers being substantially reversed. A second pinned layer having this structure will provide substantially the same features and benefits as those of the first pinned layer 316 described above. Therefore, with reference to FIG. 5, such a second pinned layer structure 318 is described.

Figure 5:
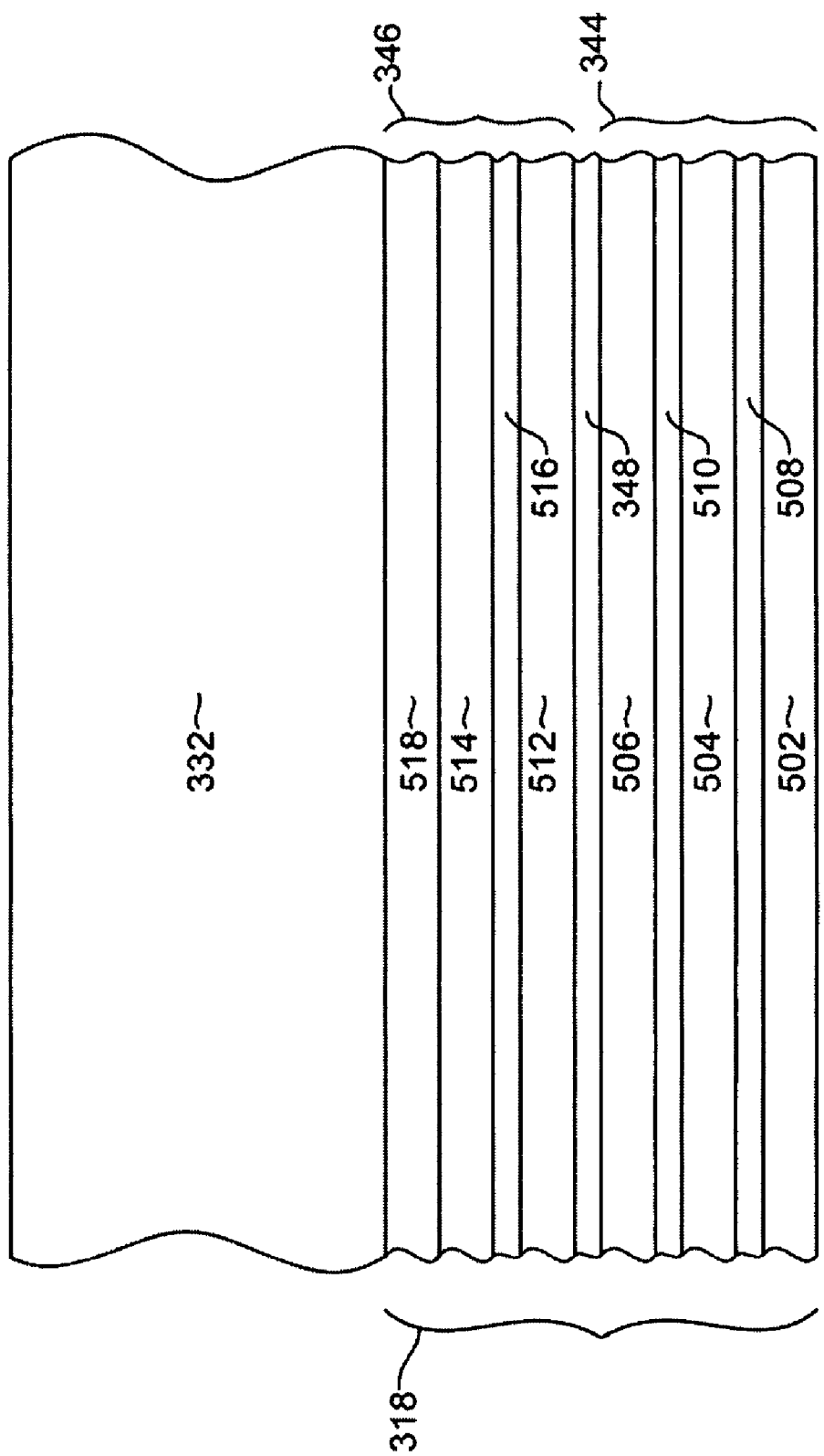
FIG. 5 is an enlarged, detailed view off a second pinned layer structure according to an embodiment of the invention.

As shown in FIG. 5, the second pinned layer structure 318 includes the AP2B layer 344, the AP1B layer 346 formed above the AP2B layer 344 and the AP coupling layer 348 sandwiched between the AP2B and AP1B layers 344, 346. The AP coupling layer 348 can be constructed of Ru and can have a thickness of 1-8 or about 5 Angstroms. The AP4 layer is exchange coupled with the second AFM layer 332, which as mentioned above is preferably IrMn or IrMnCr.

With continued reference to FIG. 5, the AP2B layer 344 includes a plurality of CoFe layers 502, 504, 506 separated by thin nano-layers 508, 510 which can be constructed of, for example, Cu. As discussed above the nano-layers 508, 510 can be constructed of other materials such as Au or Ag. The nano-layers (e.g. Cu layers) 508, 510 are sufficiently thin that they will not magnetically decouple the CoFe layers 502, 504, 506 and can each have a thickness of for example 1-7 Angstroms. The combined thicknesses of the CoFe layers is preferably 20-50 Angstroms, and the CoFe layers 502, 504, 506 can have an Fe content of 25-75 atomic percent. The number of CoFe layers 502, 504, 506 and nano-layers 508, 510 can vary, and need not necessarily be three CoFe layers and two nano-layers. A structure having three CoFe layers 502, 504, 506 and two nano-layers 508, 510 has, however, been found to provide the best results.

With reference still to FIG. 5, the AP1B layer 346 includes Co layers 512, 514 and a thin spin blocking layer 516 interspersed within the Co layers 512, 514. The Co layer 512 closest to the AP coupling layer 348 preferably has a thickness of 8-18 Angstroms. The other Co layer 514 can have a thickness that is chosen to balance the moments of the AP2B and AP1B layers 344, 346 as described earlier with reference to the first pinned layer 316 (FIG. 3). The AP1B layer also includes a layer of CoFe 518 that is exchange coupled with the second AFM layer 332. The CoFe layer 518 is preferably constructed as thin as possible while still providing robust exchange coupling with the AFM layer 332. With this in mind, the CoFe layer 518 can be 8 to 20 Angstroms thick. The CoFe layer preferably has an Fe content of 30 to 80 atomic percent.

Figure 6:
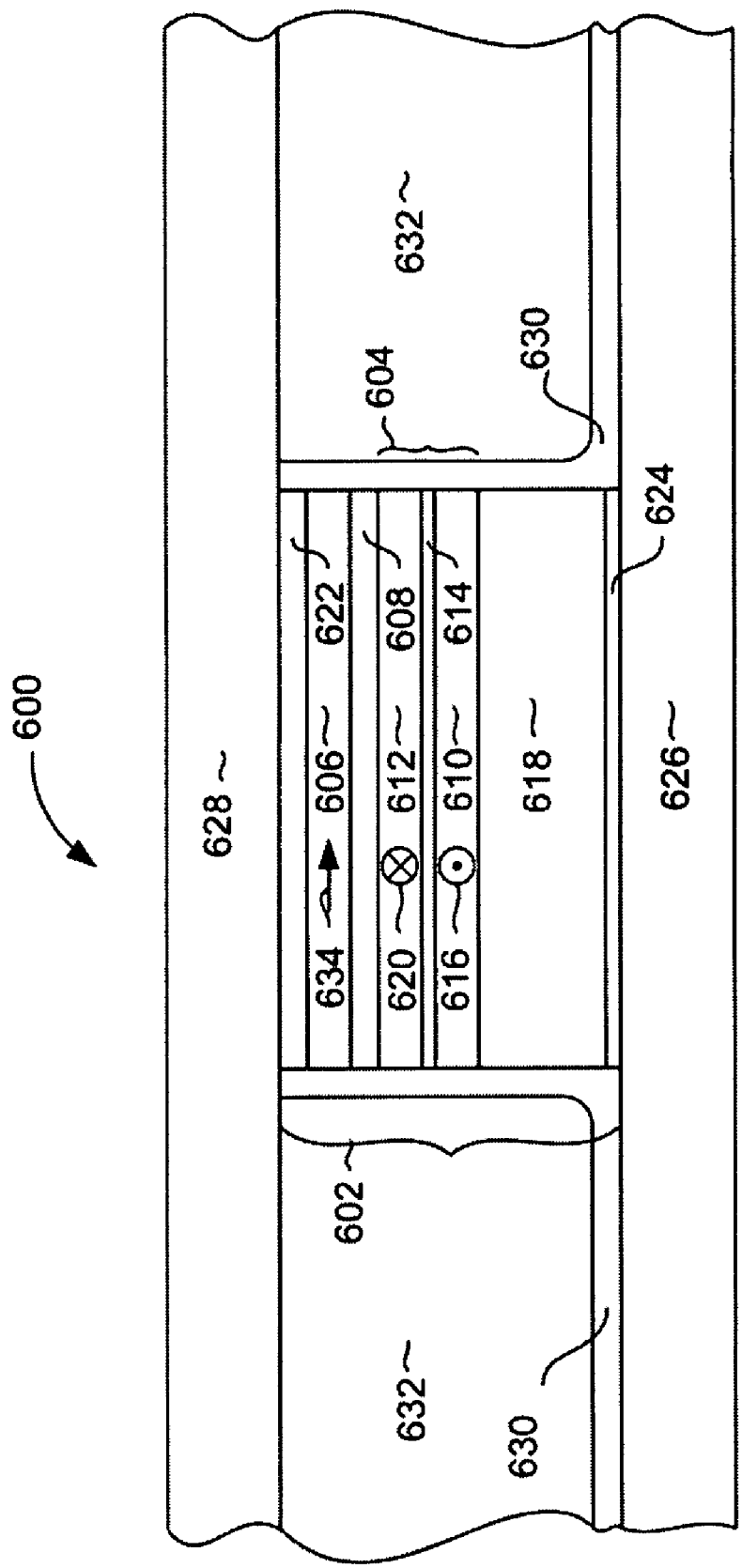
FIG. 6 is an ABS view of a magnetoresistive sensor according to another embodiment of the invention.

CPP Spin Valve with Long Diffusion Length AP1 Layers:

Although the sensor 302 described above has been described in terms of a dual CPP GMR sensor, the invention could also be embodied in a sensor such as the sensor 600 as shown in FIG. 6. With reference to FIG. 6, then, a sensor according to an embodiment of the invention includes a sensor stack 602 having a pinned layer structure 604 and a free layer structure 606, which is separated from the pinned layer structure 604 by a non-magnetic spacer layer 608. The sensor could also be a tunnel valve sensor, in which case the non-magnetic, electrically conductive spacer layer 608 would be replace by a non-magnetic, electrically insulating barrier layer.

The pinned layer structure 604 can include first and second magnetic layer structures (AP1, AP2) 610, 612, which are antiparallel coupled across a non-magnetic AP coupling layer 614. The magnetization 616 of the AP1 layer 614 is pinned by exchange coupling with a layer of antiferromagnetic material (AFM layer) 618. And the AP coupling between the AP1 and AP2 layers 610, 612 pins the magnetization 620 of the AP2 layer in a direction opposite to the magnetization 616 of the AP1 layer 610.

In addition to the pinned layer structure 604, free layer structure 606 and spacer 608, the sensor stack 602 can include a capping layer 622 formed at the top of the sensor stack 602 and can also include one or more seed layers 624. The sensor 600 can be a current perpendicular to plane sensor (such as the sensor 300 described with reference to FIG. 3) or could be a current in plane sensor. For purposes of simplicity and consistency, the sensor 600 will be described in terms of a current perpendicular to plane (CPP) sensor. As such the sensor stack can be sandwiched between first and second electrically conductive leads 626, 628, and can have insulation layers 630 formed at either side of the sensor stack 602 to prevent current shunting. Hard magnetic bias layers 632 can be formed at either side of the sensor stack for providing a magnetic bias field to stabilize the magnetization 634 of the free layer 606.

As discussed above, the AP2 layer 612 has a positive contribution to the overall GMR effect. However, the AP1 layer 610, which has its magnetization 616 opposite to that of the AP2 layer 612 has a negative contribution to GMR. Therefore, it is desirable to minimize this subtractive GMR effect in order to improve the overall GMR effect of the sensor 600. To this end, the AP1 layer is constructed so as to provide as little GMR effect as possible, while still providing the necessary magnetic moment to maintain strong pinning of the AP2 layer 612. One way to achieve this is to construct the AP1 layer to have as long a spin diffusion length as possible. Several AP1 layer structures 610 for achieving this long spin diffusion length are discussed herein below.

Figure 7:
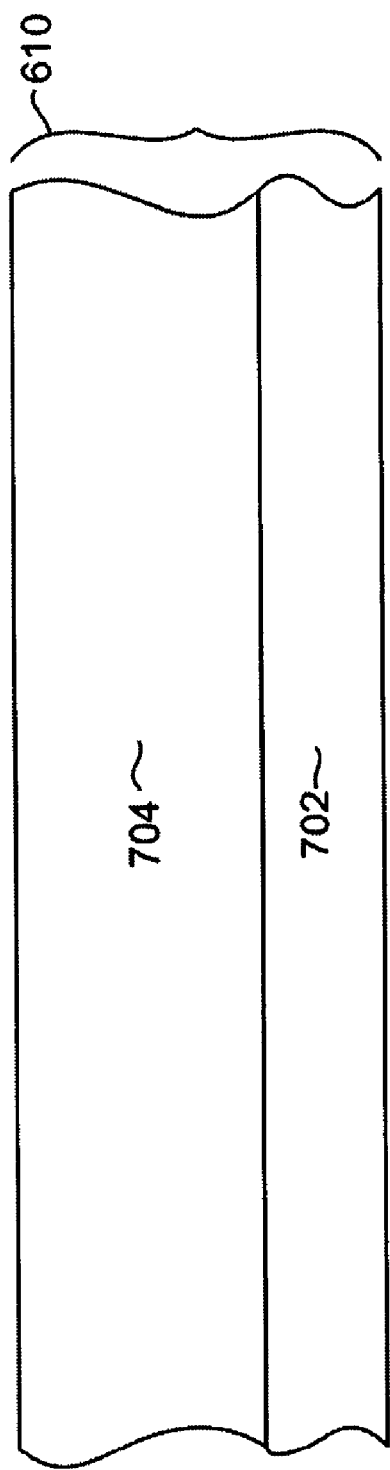
FIG. 7 is a detailed view of an AP1 layer of the sensor of FIG. 6 according to an embodiment of the invention.

With reference to FIG. 7, the AP1 layer 610 can be constructed as a bi-layer structure having a layer of CoFe 702 and a layer of Co 704. The CoFe layer does not provide optimal spin diffusion length properties, but is necessary to maintain strong exchange coupling with the AFM layer 628 (FIG. 6). Therefore, the CoFe layer 702 should be adjacent to and exchange coupled with the AFM layer 618, and the Co layer 704 is located adjacent to the AP coupling layer 614 (FIG. 6). The CoFe layer should also be as thin as possible while still maintaining good exchange coupling with the AFM layer 618. Therefore, the CoFe layer can be 10-20 Angstroms thick or about 15 Angstroms thick. The CoFe layer 702 preferably has an iron content of 30-40 atomic percent or about 35 atomic percent. The Co layer 704 (which preferably contains only trace amounts of other elements if any), can have a thickness of 25-35 Angstroms or about 28 Angstroms. The Co layer 704 provides a long spin diffusion length to minimize the GMR effect of the AP1 layer 610, while the CoFe layer 702 ensures good exchange coupling.

Figure 8:
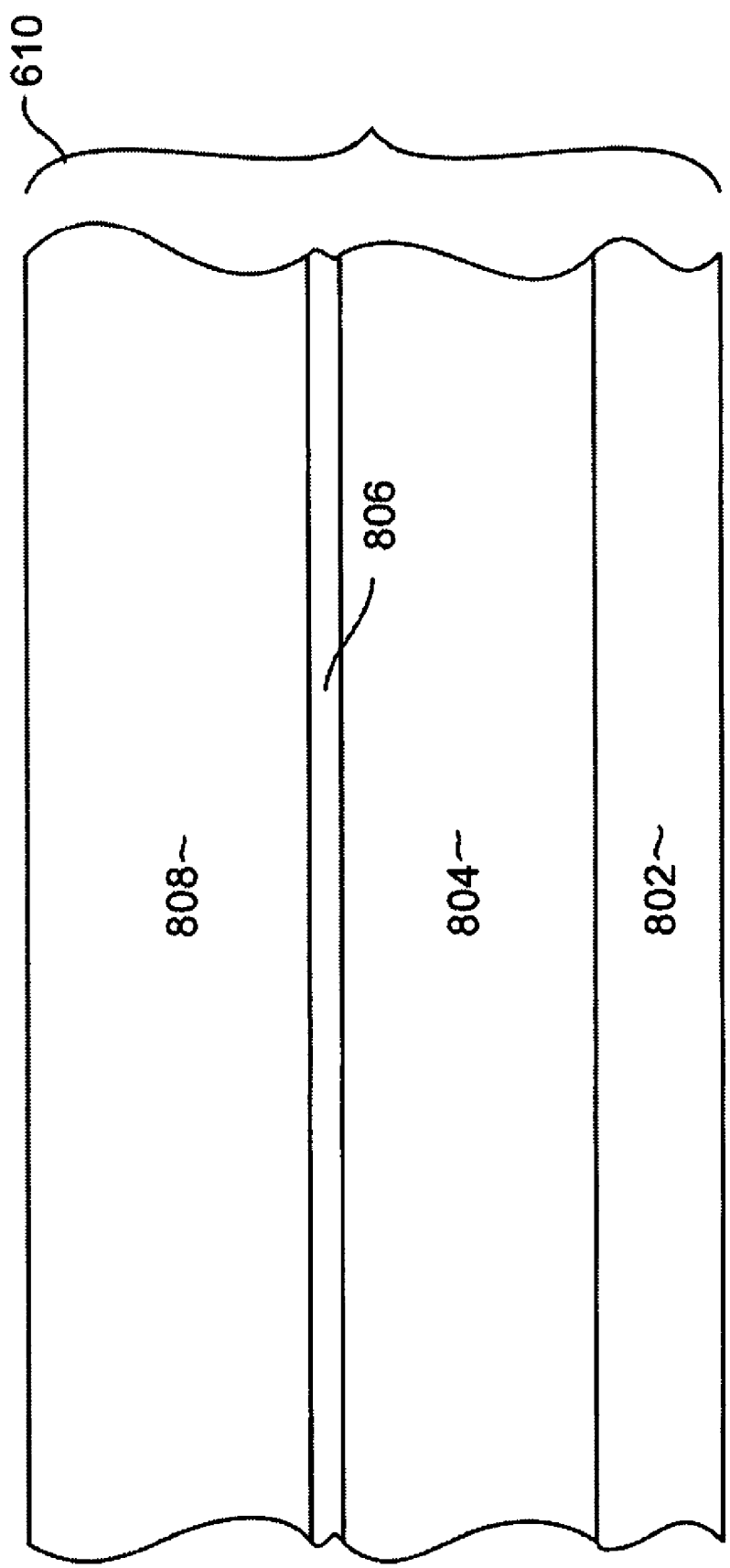
FIG. 8 is a detailed view of an AP1 layer of the sensor of FIG. 6 according to another embodiment of the invention.

With reference now to FIG. 8, in another embodiment of the invention, the AP1 layer 620 has a CoFe layer 802, a first layer of Co 804, a thin Ta layer 806, and a second layer of Co 808. As can be seen, the thin Ta layer 806 is sandwiched between the first and second Co layers 804, 808. Therefore, the Ta layer 806 must be thin enough so that it does not antiparallel couple the first and second Co layers 804, 808. The Ta layer can, therefore, have a thickness of 4 Angstroms or less. The first Co layer 804 can be 15-25 Angstroms thick or about 20 Angstroms thick.

The Ta layer 806 acts as a spin mixing layer. Since the Ta layer is non-magnetic, it scatters electrons in a manner that does not contribute to GMR. Therefore, electrons that pass through the Ta layer 806 travel through the Co layer 804 in a more scattered, less spin polarized state. This reduces the GMR contribution of the first Co layer 804. In order to maximize the effect of the Ta layer 806, it is desirable to locate the Ta layer 806 as close as possible to the AP coupling layer 614 (FIG. 6). However, Ta interferes with AP coupling, so a certain minimum thickness of magnetic material must be maintained adjacent to the AP coupling layer 614 in order ensure effective antiparallel coupling with the AP2 layer 612 (FIG. 6). Therefore, the second Co layer 808 preferably has a thickness 5-12 Angstroms or more preferably about 12 Angstroms. As with the previously described embodiment, the CoFe layer 802 is necessary to maintain strong exchange coupling with the AFM layer 618 (FIG. 6).

Figure 9:
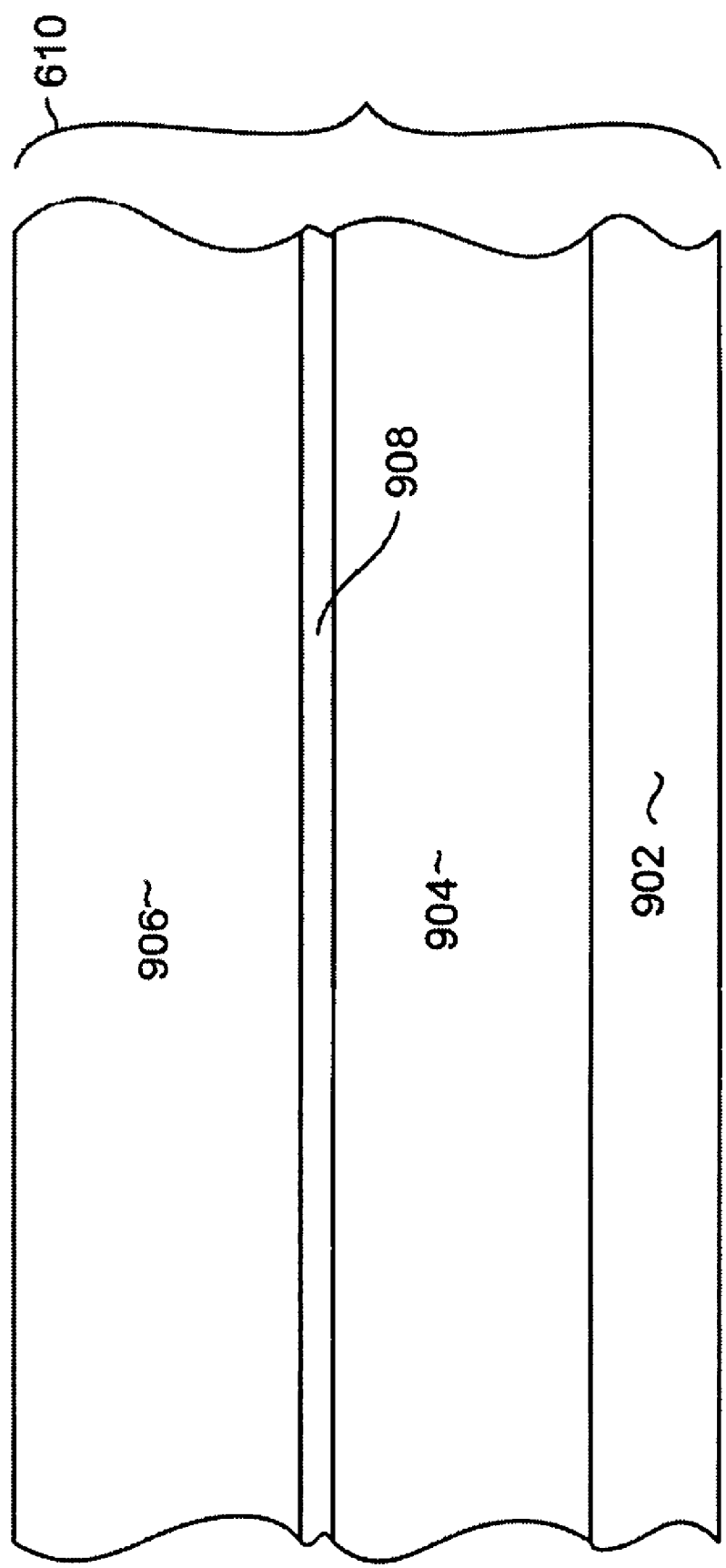
FIG. 9 is a detailed view of an AP1 layer of the sensor of FIG. 6 according to yet another embodiment of the invention.

With reference now to FIG. 9, yet another embodiment of the invention is described. In this embodiment, the AP1 layer 610 includes the CoFe layer 902 adjacent to the AFM layer 618 (FIG. 6). The AP1 layer further includes first and second Co layers 904, 906 and a thin layer of Ru sandwiched between the Co layers 904, 906. Ru has a large spill memory loss at its interfaces, so the presence of the thin Ru layer 908 reduces the GMR effect of the AP1 layer. In order to prevent antiparallel coupling the Co layers 904, 906, the Ru layer is constructed with a thickness less than 4 Angstroms, or more preferably about 2 Angstroms. In order ensure strong AP coupling with the AP2 layer 612 (FIG. 6), the Ru layer 908 should be greater than 12 Angstroms away from the AP coupling layer 614 (FIG. 6), while also being as close as possible to the AP coupling layer 614. Therefore, the second Co layer 906 preferably has a thickness of 1-12 Angstroms or about 12 Angstroms.

The embodiments described above with reference to FIGS. 7, 8 and 9 are designed to minimize the GMR effect of the AP1 layer 610 in order to maximize the overall GMR effect of the sensor 600. In general spin diffusion length is related to electrical resistivity, and alloys typically have a higher resistivity and shorter spin diffusion length than pure metals. Although the layers 704 (FIG. 7), 804, 808 (FIG. 8) and 904, 906 (FIG. 9) were described as being constructed of Co, other pure or substantially pure metal could be used as well. By pure metal, it is meant that these layers can be constructed of a metal that is not an alloy, but consists rather of a metal of a single element. For example, all of or a portion of the layers 704, 804, 808, 904, 906 could be constructed of a material such as Ni or Fe.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
    a pinned magnetic layer structure, having a first magnetic layer structure (AP1) a second magnetic layer structure (AP2) and a non-magnetic antiparallel coupling layer sandwiched between the (AP1) and (AP2) layers;
    a free magnetic layer structure;
    a non-magnetic layer sandwiched between the free layer and the pinned layer; and
    a layer of antiferromagnetic material (AFM layer) adjacent to the AP1 layer of the pinned layer structure; wherein the AP1 layer structure further comprises:
    a layer of CoFe adjacent to the AFM layer; and
    a layer of a metal consisting of a single element metal;
    wherein the layer of pure, single element metal consists of Ni.

2. A magnetoresistive sensor, comprising:
    a pinned magnetic layer structure, having a first magnetic layer structure (AP1) a second magnetic layer structure (AP2) and a non-magnetic antiparallel coupling layer sandwiched between the (AP1) and (AP2) layers;
    a free magnetic layer structure;
    a non-magnetic layer sandwiched between the free layer and the pinned layer; and
    a layer of antiferromagnetic material (AFM layer) adjacent to the AP1 layer of the pinned layer structure; wherein the AP1 layer structure further comprises:
    a layer of CoFe adjacent to the AFM layer;
    a first layer of single element metal adjacent to the layer of CoFe;
    a thin layer of Ta; and
    a second layer of single element metal, the thin layer of Ta being sandwiched between the first and second layer of single element metal.

3. A sensor as in claim 2 wherein the first and second layers of single element metal each consist of Co.

4. A sensor as in claim 2 wherein the first and second layers of single element metal each consist of Ni.

5. A sensor as in claim 2 wherein the thin layer of Ta has a thickness no greater than 4 Angstroms.

6. A sensor as in claim 2 wherein the thin layer of Ta has a thickness of about 12 Angstroms.

7. A sensor as in claim 2 wherein the thin layer of Ta has a thickness no greater than 12 Angstroms.

8. A sensor as in claim 2 wherein the layer of CoFe has 30-40 atomic percent Fe and has a thickness of 10-20 Angstroms.

9. A sensor as in claim 2, wherein:
    the layer of CoFe has 30-40 atomic percent Fe, and has a thickness of 10-20 Angstroms;
    the first layer of single element metal consists of Co and has a thickness of 15-25 Angstroms;
    the Ta layer has a thickness of about 4 Angstroms; and
    the second layer of single element metal consists of Co and has a thickness of about 12 Angstroms.

* * * * *